US009853242B2

(12) United States Patent
Nishido

(10) Patent No.: US 9,853,242 B2
(45) Date of Patent: Dec. 26, 2017

(54) SEALING STRUCTURE AND ORGANIC ELECTROLUMINESCENCE DEVICE

(71) Applicant: Semiconductor Energy Laboratory Co., Ltd., Kanagawa-ken (JP)

(72) Inventor: Yusuke Nishido, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/951,031

(22) Filed: Jul. 25, 2013

(65) Prior Publication Data
US 2014/0027743 A1    Jan. 30, 2014

(30) Foreign Application Priority Data
Jul. 30, 2012  (JP) ................... 2012-168388

(51) Int. Cl.
| H01L 29/08 | (2006.01) |
| H01L 51/52 | (2006.01) |
| B32B 3/30  | (2006.01) |
| B32B 7/12  | (2006.01) |
| B32B 7/14  | (2006.01) |
| B32B 9/00  | (2006.01) |
| B32B 15/04 | (2006.01) |
| B32B 15/18 | (2006.01) |
(Continued)

(52) U.S. Cl.
CPC ............ *H01L 51/5253* (2013.01); *B32B 3/30* (2013.01); *B32B 7/12* (2013.01); *B32B 7/14* (2013.01); *B32B 9/002* (2013.01); *B32B 9/005* (2013.01); *B32B 15/043* (2013.01); *B32B 15/18* (2013.01); *B32B 15/20* (2013.01); *H01L 27/3276* (2013.01); *H01L 51/5246* (2013.01); *B32B 2255/06* (2013.01); *B32B 2255/26* (2013.01); *B32B 2307/206* (2013.01); *B32B 2457/00* (2013.01); *Y10T 428/239* (2015.01)

(58) Field of Classification Search
CPC .......... H01L 29/66757; H01L 27/3244; H01L 51/5253; H01L 27/3276; H01L 51/5246; B32B 3/30; B32B 7/12; B32B 7/14; B32B 9/002; B32B 9/005; B32B 15/043; B32B 15/18; B32B 15/20
USPC ........................................................ 257/40
See application file for complete search history.

(56) References Cited

U.S. PATENT DOCUMENTS 6,113,450 A   9/2000 Narayanan et al.
6,646,284 B2  11/2003 Yamazaki et al.
(Continued)

FOREIGN PATENT DOCUMENTS

EP    1 818 997 A2    8/2007
JP    5-208852        8/1993
(Continued)

*Primary Examiner* — Trung Q Dang
*Assistant Examiner* — Patricia Reddington
(74) *Attorney, Agent, or Firm* — Husch Blackwell LLP

(57) ABSTRACT

A sealing structure with high air-tightness and an organic electroluminescence device with high air-tightness are provided regardless of a pattern of a first metal layer overlapping with glass frit. A second metal layer is provided in a region where a common power supply line overlaps with the glass frit. Since laser light is absorbed or reflected by the second metal layer, the glass frit can be uniformly heated. Therefore, an object to be sealed can be sealed with a low-melting-point glass in which a crack is not easily generated.

18 Claims, 8 Drawing Sheets

(51) Int. Cl.
   *B32B 15/20*   (2006.01)
   *H01L 27/32*   (2006.01)

(56) References Cited

U.S. PATENT DOCUMENTS

| | | | |
|---|---|---|---|
| 6,803,246 B2 | 10/2004 | Mizukami et al. | |
| 6,860,780 B2 | 3/2005 | Miyashita et al. | |
| 6,984,159 B1 | 1/2006 | Kado et al. | |
| 6,998,776 B2 | 2/2006 | Aitken et al. | |
| 7,045,944 B2 | 5/2006 | Ushifusa et al. | |
| 7,121,642 B2 | 10/2006 | Stoessel et al. | |
| 7,385,347 B2 | 6/2008 | Song et al. | |
| 7,407,423 B2 | 8/2008 | Aitken et al. | |
| 7,431,628 B2 | 10/2008 | Park et al. | |
| 7,602,121 B2 | 10/2009 | Aitken et al. | |
| 7,701,136 B2 | 4/2010 | Kwak | |
| 7,780,493 B2 | 8/2010 | Choi et al. | |
| 7,837,530 B2 | 11/2010 | Park | |
| 7,868,540 B2 | 1/2011 | Kim | |
| 7,871,949 B2 | 1/2011 | Lee et al. | |
| 7,944,143 B2 | 5/2011 | Choi et al. | |
| 8,063,560 B2 | 11/2011 | Aitken et al. | |
| 8,125,146 B2 | 2/2012 | Park | |
| 8,164,257 B2 | 4/2012 | Choi et al. | |
| 8,545,281 B2 | 10/2013 | Shimomura et al. | |
| 8,623,469 B2 | 1/2014 | Shimomura et al. | |
| 8,698,190 B2 | 4/2014 | Yokoyama et al. | |
| 8,816,336 B2 | 8/2014 | Shimomura | |
| 8,950,216 B2 | 2/2015 | Tanaka | |
| 9,048,350 B2 | 6/2015 | Nishido | |
| 2004/0150319 A1* | 8/2004 | Tomimatsu et al. | 313/495 |
| 2006/0006424 A1* | 1/2006 | Yamazaki et al. | 257/222 |
| 2006/0220549 A1 | 10/2006 | Kim et al. | |
| 2007/0170850 A1* | 7/2007 | Choi et al. | 313/506 |
| 2007/0170854 A1 | 7/2007 | Kwak | |
| 2007/0176549 A1 | 8/2007 | Park | |
| 2007/0176552 A1* | 8/2007 | Kwak | 313/512 |
| 2007/0232182 A1 | 10/2007 | Park | |
| 2009/0058292 A1 | 3/2009 | Koo et al. | |
| 2010/0079065 A1 | 4/2010 | Kamiura | |
| 2011/0205470 A1* | 8/2011 | Kim | 349/96 |
| 2012/0318023 A1 | 12/2012 | Shimomura | |
| 2013/0048967 A1 | 2/2013 | Nishido et al. | |
| 2013/0049062 A1 | 2/2013 | Hatano et al. | |
| 2013/0095582 A1 | 4/2013 | Miyairi et al. | |
| 2013/0134396 A1 | 5/2013 | Shimomura et al. | |
| 2013/0134397 A1 | 5/2013 | Yamazaki et al. | |
| 2013/0134398 A1 | 5/2013 | Yamazaki et al. | |
| 2013/0137200 A1 | 5/2013 | Shimomura | |
| 2013/0213852 A1 | 8/2013 | Yamazaki et al. | |
| 2014/0042394 A1* | 2/2014 | Lee | 257/40 |

FOREIGN PATENT DOCUMENTS

| | | |
|---|---|---|
| JP | 2004-085769 A | 3/2004 |
| JP | 2007-220647 A | 8/2007 |
| JP | 2010-080339 A | 4/2010 |
| JP | 2010-080341 A | 4/2010 |
| JP | 2010-244766 A | 10/2010 |
| JP | 2010-244866 A | 10/2010 |
| JP | 2011-65895 | 3/2011 |
| JP | 2011-70797 | 4/2011 |
| JP | 2011-258492 A | 12/2011 |
| JP | 2012-113968 A | 6/2012 |

* cited by examiner

SEALING STRUCTURE AND ORGANIC ELECTROLUMINESCENCE DEVICE

BACKGROUND OF THE INVENTION

1. Field of the Invention

The present invention relates to a sealing structure and an organic electroluminescence device.

2. Description of the Related Art

Research and development have been extensively conducted on organic electroluminescence elements. In the fundamental structure of the organic electroluminescence element, a layer containing a light-emitting organic compound is interposed between a pair of electrodes. By applying voltage to this element, light emission from the light-emitting organic compound can be obtained.

The light-emitting device using an organic electroluminescence element is, for example, a lighting device, or an image display device including a thin film transistor. The organic electroluminescence element can be formed in a film shape and thus easily increased in area, which allows a lighting device with a planar light source to be realized. In addition, an image display device using an organic electroluminescence element needs no backlight which is necessary for liquid crystal display devices and the like; therefore, thin, lightweight, high contrast, and low power consumption display devices can be obtained.

It is known that when the organic electroluminescence element is exposed to the air (including moisture, oxygen, and the like), its performance degrades rapidly. It is thus required that the organic electroluminescence element be hermitically sealed with a material having a high gas barrier property so as not to be exposed to the air.

A sealing technique using glass frit including a low-melting-point glass is known as a technique that realizes sealing with a high gas barrier property. The technique disclosed in Patent Document 1 is as follows: a paste containing a binder and a frit material including a low-melting-point glass is applied onto a glass substrate; the binder is removed through prebaking; and the glass frit is irradiated with laser light while a counter glass substrate is provided over the glass substrate, whereby the glass frit is melted and the substrates are bonded to each other and sealed with the glass frit. When a device using an organic electroluminescence element is sealed with such glass frit, the organic electroluminescence element can be isolated from the external air and a light-emitting device with high reliability can be realized.

In a light-emitting device to which an organic electroluminescence element is applied, there are common power supply lines between a substrate and glass frit and the number of common power supply lines overlapping the glass frit varies depending on the location. For example, there is a plurality of common power supply lines between the glass frit and the substrate at an edge portion of one side of a sealing structure and there is one common power supply line between the glass frit and the substrate at the middle portion of the one side of the sealing structure. When the glass frit is irradiated with laser light, the laser light is absorbed or reflected by the common power supply lines. Therefore, in the case where the degree of overlap between the common power supply lines and the glass frit varies depending on the location, there is a problem in that a difference is generated in the temperature distribution of the glass frit and the glass frit cannot be sufficiently melted; thus, a sealing structure with high air-tightness and an organic electroluminescence device with high air-tightness cannot be manufactured.

REFERENCE

[Patent Document 1] Japanese Published Patent Application No. 2011-65895

SUMMARY OF THE INVENTION

Therefore, the present invention was made to solve the above problem and an object of the present invention is to provide a sealing structure with high air-tightness and an organic electroluminescence device with high air-tightness regardless of a pattern of a common power supply line overlapping with glass frit.

In order to achieve the above object, one embodiment of the present invention is a sealing structure including a first substrate including a first metal layer, a first insulating layer covering the first metal layer, a second metal layer overlapping with at least part of the first metal layer with the first insulating layer therebetween, and a second insulating layer over the second metal layer, which are provided over a first surface; a second substrate facing the first surface with a space kept between the first substrate and the second substrate; and a sealant for sealing the space between the first substrate and the second substrate, in which the first metal layer has a pattern crossing the sealant, and the sealant is in contact with the second insulating layer on the first substrate side and overlaps with the second metal layer at an intersection of the first metal layer and the sealant.

In the above structure, it is preferable that a material of the sealant be a low-melting-point glass.

In the above structure, it is preferable that the first metal layer have a linear pattern.

Further, one embodiment of the present invention is an organic electroluminescence device including a first substrate provided with a pixel region and a non-pixel region which is a region other than the pixel region; a second substrate facing the first substrate with a space kept between the first substrate and the second substrate; and a sealant for sealing the space between the first substrate and the second substrate, in which the pixel region comprises a thin film transistor including a semiconductor layer, a gate insulating layer, a gate electrode layer, a source electrode layer, and a drain electrode layer, a first electrode layer electrically connected to a source electrode or a drain electrode of the thin film transistor, a partition wall covering an edge portion of the first electrode layer, a light-emitting layer provided over the first electrode layer and the partition wall, and a second electrode layer provided over the light-emitting layer, in which the non-pixel region comprises a first metal layer, the gate insulating layer covering the first metal layer, a second metal layer overlapping with at least part of the first metal layer with the gate insulating layer therebetween, and a second insulating layer over the second metal layer, in which the first metal layer has a pattern crossing the sealant, and in which the sealant is in contact with the second insulating layer on the first substrate side and overlaps with the second metal layer at an intersection of the first metal layer and the sealant.

In the above structure, it is preferable that a material of the sealant be a low-melting-point glass.

In the above structure, it is preferable that the first metal layer be a common power supply line.

In the above structure, it is preferable that the first metal layer be electrically connected to any one of the gate electrode layer, the source electrode layer, the drain electrode layer, and the first electrode layer.

With the structures of a sealing structure and an organic electroluminescence device of one embodiment of the present invention, a sealing structure with high air-tightness and an organic electroluminescence device with high air-tightness can be obtained. Further, flexibility in the layout of the first metal layer serving as a common power supply line can be increased.

DETAILED DESCRIPTION OF THE INVENTION

Hereinafter, embodiments of the invention disclosed in this specification will be described with reference to the accompanying drawings. Note that the present invention is not limited to the following description, and it is easily understood by those skilled in the art that modes and details of the present invention can be modified in various ways. Therefore, the invention disclosed in this specification is not construed as being limited to the description of the following embodiments.

Embodiment 1

A structure of a sealing structure which is one embodiment of the present invention is described below in detail.

Figure 1A:
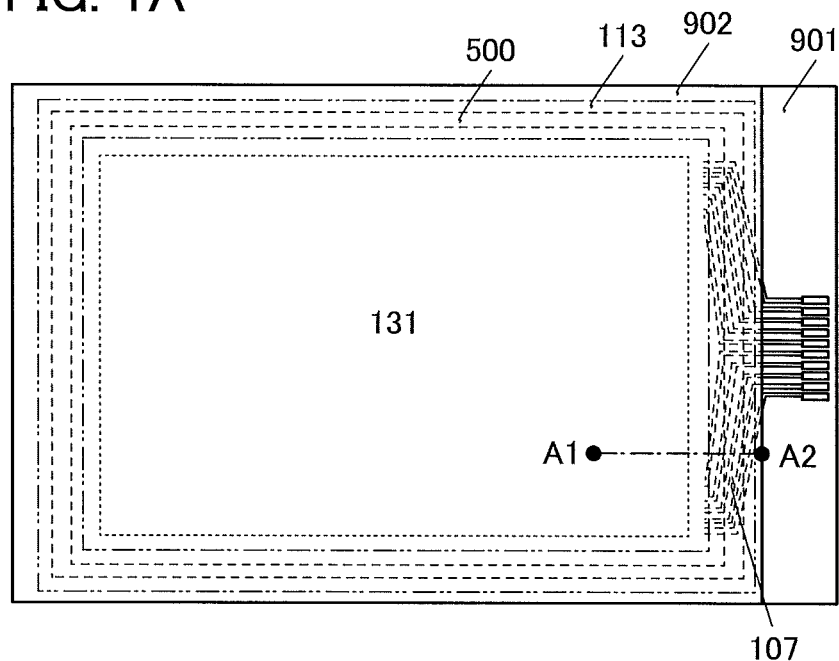
FIG. 1A is a top view and FIG. 1B is a cross-sectional view of a sealing structure according to one embodiment of the present invention.
Figure 1B:
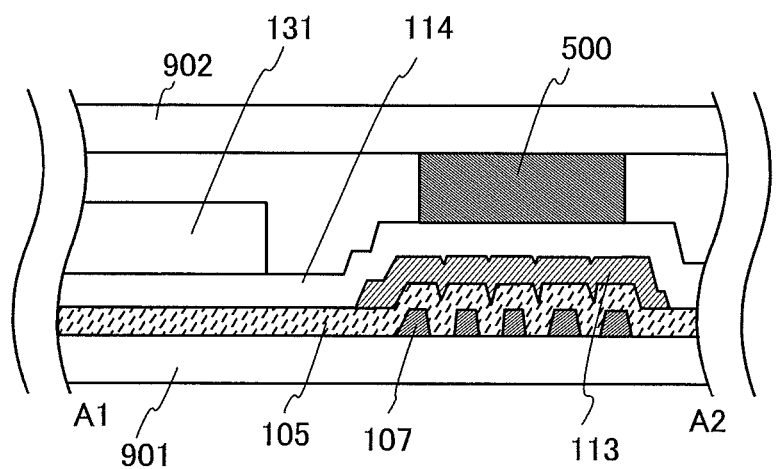
Figure 2A:
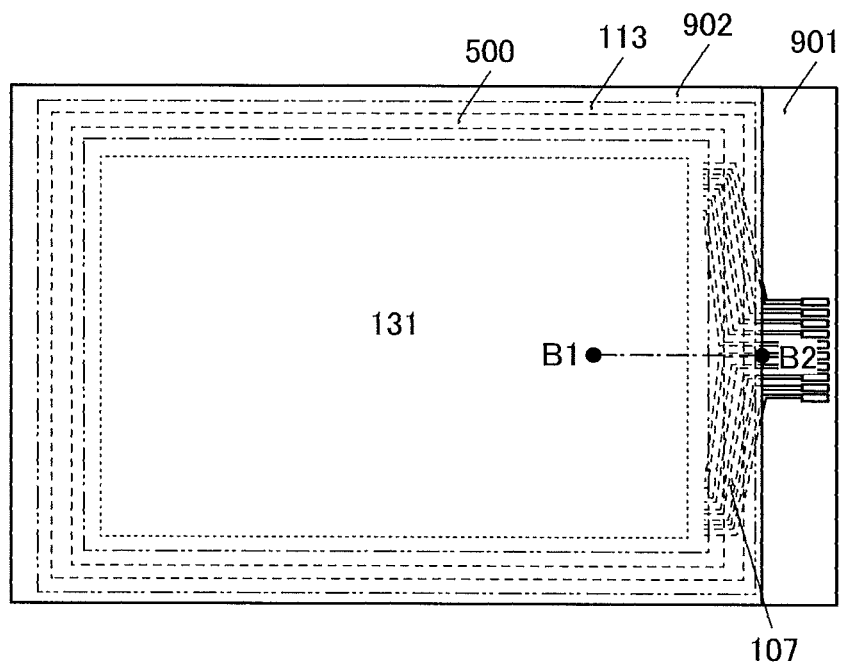
FIG. 2A is a top view and FIG. 2B is a cross-sectional view of a sealing structure according to one embodiment of the present invention.
Figure 2B:
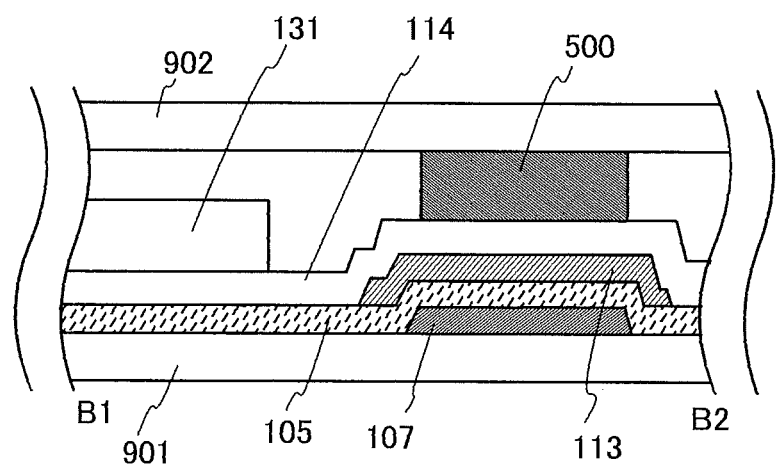

FIG. 1A and FIG. 2A are top views of a sealing structure, and FIG. 1B and FIG. 2B are schematic cross-sectional views of part of the sealing structure.
<Structure of Sealing Structure>

In the sealing structure illustrated in FIG. 1B, a light-emitting element 131 is sealed by a first substrate 901, a second substrate 902, and a sealant 500. A first metal layer 107 is provided over the first substrate 901 and a first insulating layer 105 is provided in contact with the first metal layer 107. A second metal layer 113 is provided so as to overlap with the sealant 500 and be in contact with the first insulating layer 105. A second insulating layer 114 is provided in contact with the first insulating layer 105 and the sealant 500. The first metal layer 107 is covered with the second metal layer 113 with the first insulating layer 105 therebetween, and the second metal layer 113 is provided between the first metal layer 107 and the sealant 500 in a region where the first metal layer 107 and the sealant 500 overlap with each other.
<Members Forming Sealing Structure>

Members forming the sealing structure which is one embodiment of the present invention are described below.
(First Substrate and Second Substrate)

As each of the first substrate 901 and the second substrate 902, a glass substrate, a quartz substrate, a sapphire substrate, a ceramic substrate, a metal substrate, or the like can be used. For at least one of the first substrate 901 and the second substrate 902, a substrate transmitting laser light used for forming the sealant 500 is used.
(First Metal Layer)

The first metal layer 107 includes a region overlapping with the sealant 500. The first metal layer 107 is preferably formed using a metal material such as molybdenum, titanium, tantalum, tungsten, aluminum, copper, chromium, neodymium, or scandium, or an alloy material which contains any of these materials as a main component. The first metal layer 107 is led from the inside of the sealant 500 having a frame-shape to the outside to cross the sealant 500. Therefore, in a cross section of a portion where the first metal layer 107 overlaps with the sealant 500, a plurality of first metal layers 107 crosses the sealant 500 at an end of one side of the sealing structure (FIG. 1B). The number of the first metal layers 107 crossing the sealant 500 at the middle of the one side of the sealing structure is smaller than that at the end of the one side of the sealing structure (FIG. 2B).

In the case where the second metal layer 113 described later is not provided, when glass frit provided in a sealant formation region is irradiated with laser light, the laser light is absorbed or reflected by the first metal layer 107 overlapping with the sealant formation region. Therefore, heat applied to the glass fit varies depending on the layout of the first metal layer 107 crossing the sealant formation region. When there is a difference in heat applied to the glass frit, a crack is easily generated in a low-melting-point glass included in the sealant 500. Therefore, for the pitch or the width of the first metal layer 107, absorption or reflectance of the laser light or the like has needed to be considered. However, in the case where the second metal layer 113 described later is provided, the laser light is absorbed or reflected by the second metal layer 113 and thus the glass frit can be uniformly heated. Therefore, the layout of the first metal layer 107 overlapping with the sealant formation region (e.g., the pitch or the width of the first metal layer 107) can be freely set.
(First Insulating Layer)

The first insulating layer 105 is provided in order to prevent an electrical short circuit between the first metal layer 107 and the second metal layer 113. The first insulating layer 105 is preferably formed using a silicon nitride film which is deposited by a plasma CVD method in which a mixed gas of silane ($SiH_4$) and nitrogen ($N_2$) is supplied. As the first insulating layer 105, another inorganic insulating film can be used; for example, a material similar to the material which can be used for a buffer layer described in Embodiment 2 can be used.

(Second Metal Layer)

The second metal layer 113 is provided so that the glass frit can be heated uniformly with laser light to be melted. By provision of the second metal layer 113, the layout of the first metal layer 107 overlapping with the sealant formation region can be freely set. The second metal layer 113 is provided so as to be in contact with the first insulating layer 105 and overlap with the sealant 500. As a material of the second metal layer 113, a material similar to the material which can be used for the first metal layer 107 can be used.

(Second Insulating Layer)

In order to increase the adhesion of the sealant 500 to a layer in contact with the sealant 500, it is preferable that the second insulating layer 114 and the sealant 500 be provided in contact with each other in the sealing structure. The second insulating layer 114 is preferably formed using a silicon nitride film which is deposited by a plasma CVD method in which a mixed gas of silane ($SiH_4$) and nitrogen ($N_2$) is supplied. As the second insulating layer 114, another inorganic insulating film can be used; for example, a material similar to the material which can be used for a buffer layer or a gate insulating layer described in Embodiment 2 can be used.

(Sealant)

The sealant 500 seals an object to be sealed and forms a sealing structure with high air-tightness together with the first substrate 901 and the second substrate 902. The sealant 500 is provided in contact with the second insulating layer 114. The sealant 500 is provided so as to overlap with the second metal layer 113. The sealant 500 is preferably formed using a low-melting-point glass. The low-melting-point glass is formed by irradiating glass frit with laser light and the laser light is absorbed or reflected by the glass frit and the second metal layer. Since the second metal layer 113 is formed so as to overlap with a region where the first metal layer 107 and a region where a paste including glass fit is applied overlap with each other, heat of the laser light is applied to the glass frit uniformly and the low-melting-point glass uniform in quality can be formed. Thus, the sealing structure with high air-tightness can be obtained. A material which can be used for the glass frit preferably contains one or more compounds selected from, for example, the following group: magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass.

In the structure of the sealing structure which is one embodiment of the present invention, the second metal layer 113 is provided between the sealant 500 and the first metal layer 107; therefore, the layout of the first metal layer 107 overlapping with the sealant 500 can be freely set. Further, laser light is absorbed or reflected by the second metal layer 113; therefore, a low-melting-point glass uniform in quality can be formed and a sealing structure with high air-tightness can be obtained.

Modification Example

Figure 8:
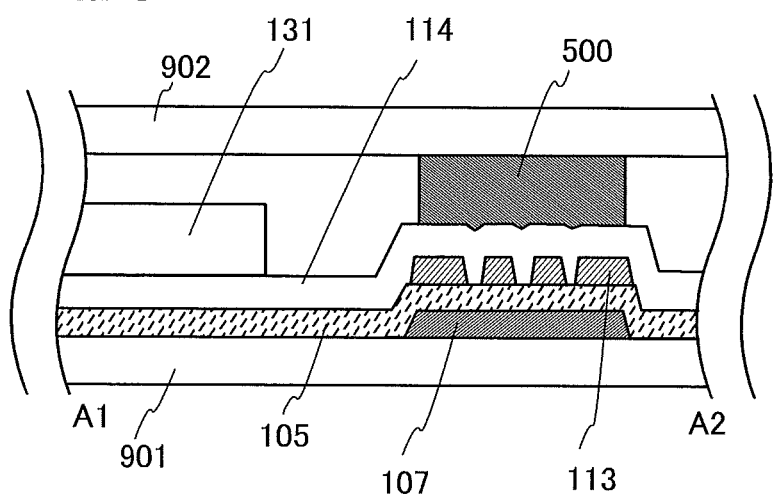
FIG. 8 is a cross-sectional view illustrating a modification example of a sealing structure according to one embodiment of the present invention.

FIG. 8 illustrates a modification example of the sealing structure of FIG. 2B and the second metal layer 113 is provided with holes. The second insulating layer 114 provided in contact with the second metal layer 113 has an uneven surface due to the holes. The sealant 500 fills in the unevenness provided in the second insulating layer 114; thus, an anchor effect is caused. Therefore, the adhesion between the sealant 500 and the second insulating layer 114 is increased and a sealing structure with high air-tightness can be obtained.

This embodiment can be combined with any of the other embodiments disclosed in this specification as appropriate.

Embodiment 2

A structure of an organic electroluminescence device which is one embodiment of the present invention is described below in detail.

<Structure of Organic Electroluminescence Device>

Figure 3A:
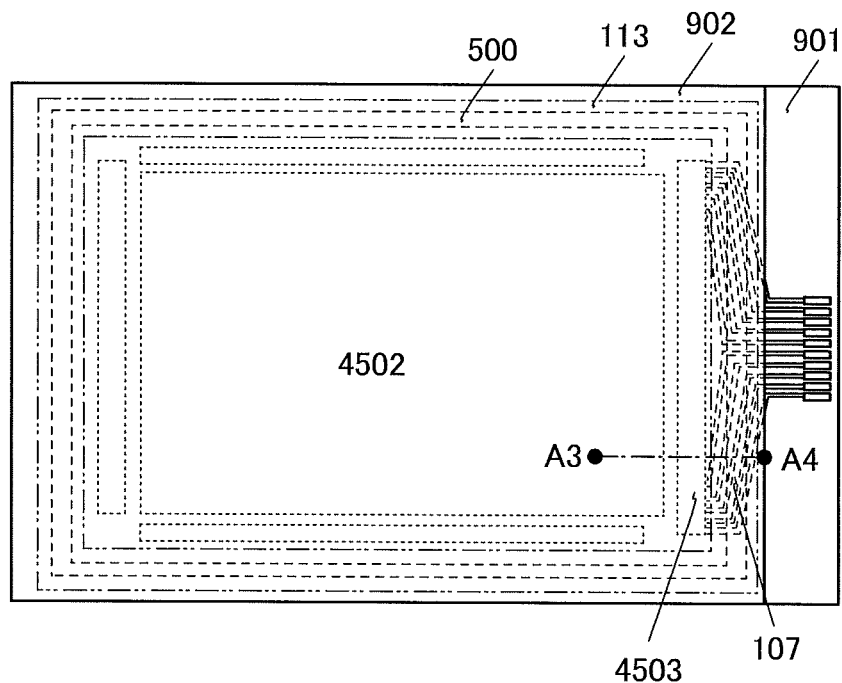
FIG. 3A is a top view and FIG. 3B is a cross-sectional view of an organic electroluminescence device according to one embodiment of the present invention.
Figure 3B:
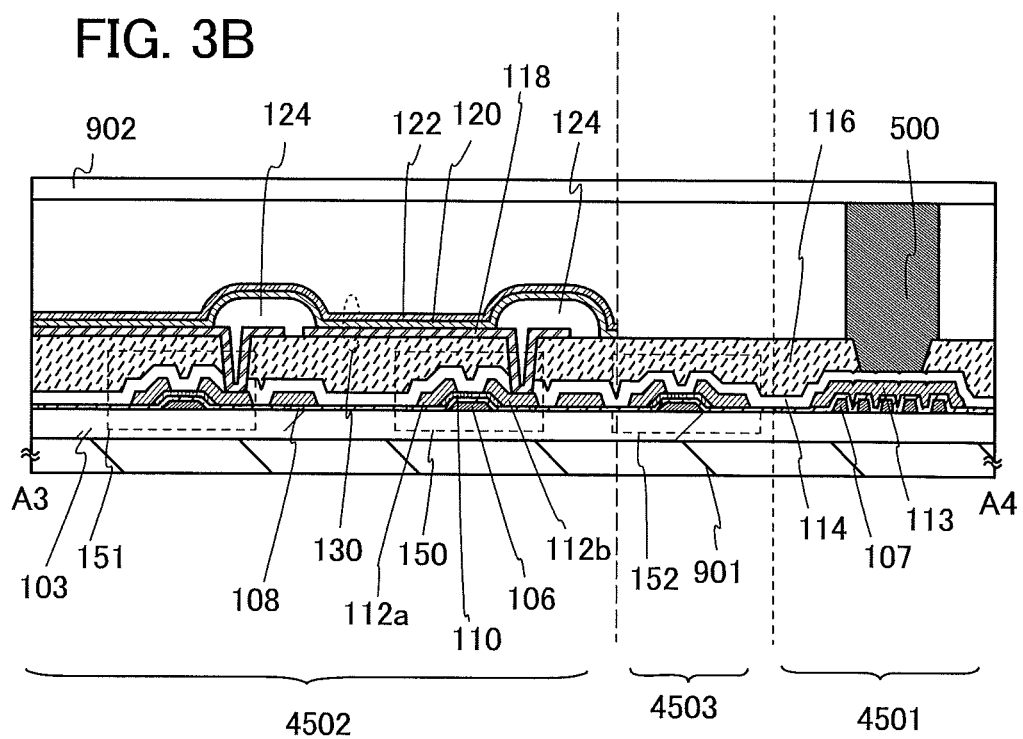
Figure 4A:
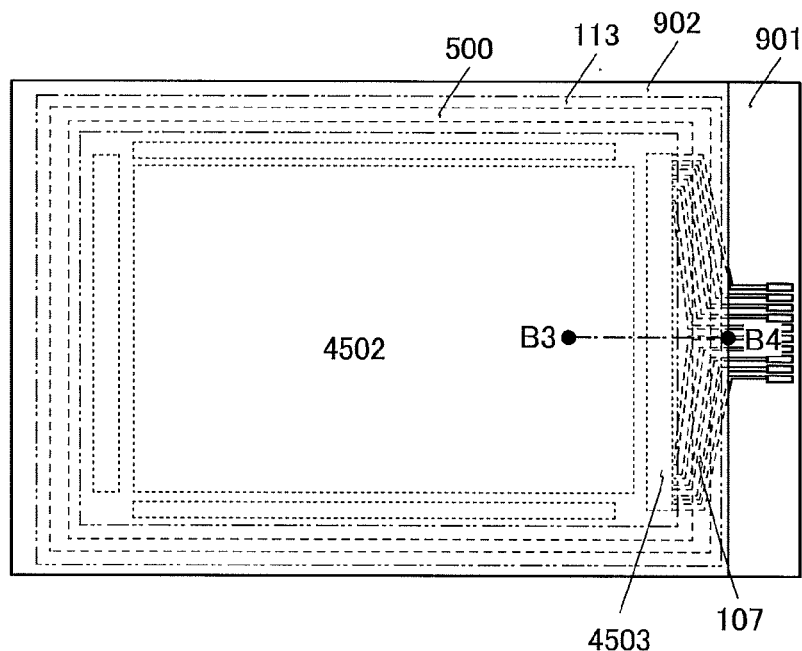
FIG. 4A is a top view and FIG. 4B is a cross-sectional view of an organic electroluminescence device according to one embodiment of the present invention.
Figure 4B:
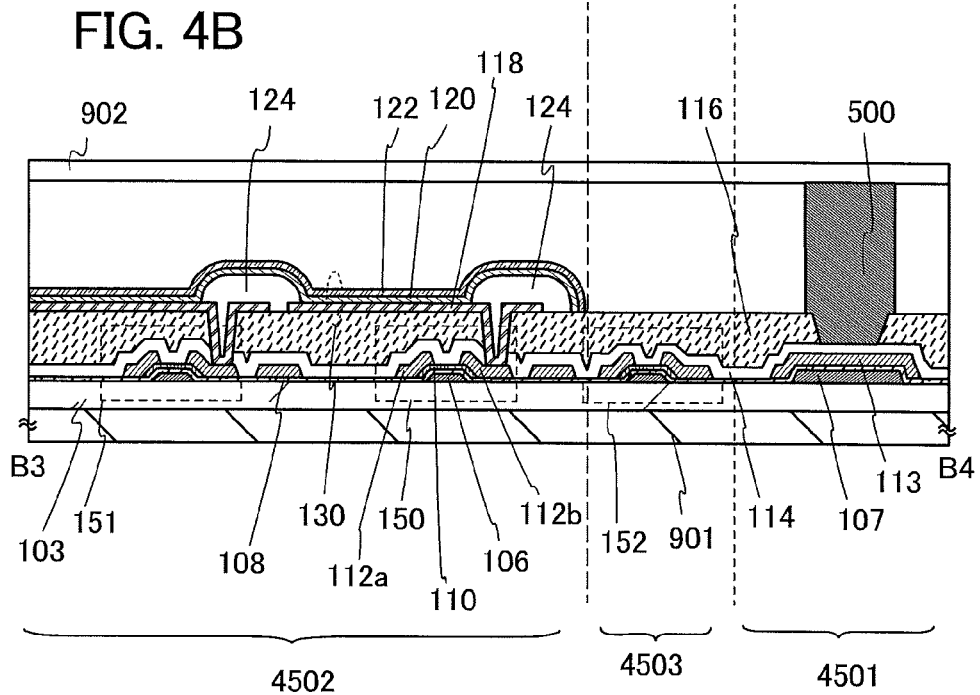

FIG. 3A and FIG. 4A are top views of an organic electroluminescence device, and FIG. 3B and FIG. 4B are schematic cross-sectional views of part of the organic electroluminescence device, in which specific structures of a sealing portion 4501, a pixel portion 4502, and a signal line circuit portion 4503 are shown.

As illustrated in FIG. 3B, the organic electroluminescence device includes the first substrate 901, a buffer layer 103, a plurality of transistors, the second insulating layer 114, a planarization layer 116, a light-emitting element 130, partition walls 124, and the second substrate 902 in the pixel portion 4502.

As illustrated in FIG. 3B, the plurality of transistors is provided over the first substrate 901, and the light-emitting element 130 is provided over each of transistors 150 and 151. Each transistor includes a gate electrode layer 106, a source electrode layer 112a, a drain electrode layer 112b, a semiconductor layer 110, and a gate insulating layer 108. The transistors 150 and 151 are transistors for driving the light-emitting elements. The light-emitting element 130 is provided over the planarization layer 116, and a first electrode layer 118 of the light-emitting element 130 is electrically connected to the transistor through a contact hole provided in the planarization layer 116. The light-emitting element 130 is sealed by the first substrate 901, the sealant 500, and the second substrate 902. A color filter or a touch panel may be provided on the first substrate 901 side of the second substrate 902.

In this embodiment, the organic electroluminescence device having a top emission structure is described; however, the organic electroluminescence device may have a bottom emission structure or a dual emission structure.

The light-emitting element 130 includes the first electrode layer 118 which is electrically connected to the transistor, an organic compound-containing layer 120 over the first electrode layer 118, and a second electrode layer 122 over the organic compound-containing layer 120. Edge portions of the first electrode layer 118 are covered with the partition walls 124. The second electrode layer 122 is formed over the entire area of the pixel portion 4502.

As illustrated in FIG. 3B, the organic electroluminescence device includes a transistor 152 in the signal line circuit portion 4503.

<Members Forming Organic Electroluminescence Device>

Members forming the organic electroluminescence device which is one embodiment of the present invention are described below.

(Buffer Layer)

It is preferable that the buffer layer 103 have a function of preventing diffusion of impurities such as mobile ions into the semiconductor layer 110. For example, the buffer layer 103 can be formed using one or more insulating films selected from the following: an oxide insulating film such as a silicon oxide film, a gallium oxide film, a hafnium oxide film, an yttrium oxide film, or an aluminum oxide film; a nitride insulating film such as a silicon nitride film or an aluminum nitride film; an oxynitride insulating film such as a silicon oxynitride film or an aluminum oxynitride film; or a nitride oxide insulating film such as a silicon nitride oxide film. Note that "nitride oxide" contains more nitrogen than oxygen and "oxynitride" contains more oxygen than nitrogen.

(Gate Electrode Layer)

The gate electrode layer 106 serves as a gate electrode of each of the transistors. The gate electrode layer 106 can be formed using a metal material such as molybdenum, titanium, tantalum, tungsten, aluminum, copper, chromium, neodymium, or scandium, or an alloy material containing any of these materials as its main component. Alternatively, a semiconductor film typified by a polycrystalline silicon film doped with an impurity element such as phosphorus, or a silicide film such as a nickel silicide film may be used as the gate electrode layer 106. The gate electrode layer 106 may have a single-layer structure or a stacked-layer structure.

(First Metal Layer)

The first metal layer 107 is electrically connected to any one of the gate electrode layer, the source electrode layer, and the drain electrode layer of the transistor and the first electrode layer 118, and serves as a common power supply line. The first metal layer 107 includes a region overlapping with the sealant 500. It is preferable that the first metal layer 107 be formed using a material similar to the material of the gate electrode layer 106. The first metal layer 107 is led as a common power supply line. Therefore, in a cross section of a portion where the first metal layer 107 overlaps with the sealant 500, a plurality of first metal layers 107 crosses the sealant 500 at an end of one side of the organic electroluminescence device (FIG. 3B). The number of the first metal layers 107 crossing the sealant 500 at the middle of the one side of the organic electroluminescence device is smaller than that at the end of the one side of the organic electroluminescence device (FIG. 4B).

In the case where the second metal layer 113 described later is not provided, when glass frit provided in a sealant formation region is irradiated with laser light, the laser light is absorbed or reflected by the first metal layer 107 overlapping with the sealant formation region. Therefore, heat applied to the glass frit varies depending on the layout of the first metal layer 107 crossing the sealant formation region. When there is a difference in heat applied to the glass frit, a crack is easily generated in a low-melting-point glass included in the sealant 500. Therefore, for the pitch or the width of the first metal layer 107, absorption or reflectance of the laser light or the like has needed to be considered. However, in the case where the second metal layer 113 described later is provided, the laser light is absorbed or reflected by the second metal layer 113 and thus the glass frit can be uniformly heated. Therefore, the layout of the first metal layer 107 overlapping with the sealant formation region (e.g., the pitch or the width of the first metal layer 107) can be freely set.

(Gate Insulating Layer)

The gate insulating layer 108 can be formed using a material similar to the material which can be used for the buffer layer.

The gate insulating layer 108 is formed by a plasma chemical vapor deposition (CVD) method or a sputtering method. In the case where a plasma CVD method is used, it is particularly preferable to use a plasma CVD method in which plasma is generated utilizing electric-field energy of a microwave and a source gas for the gate insulating film is excited by the plasma, and the excited source gas is reacted on a surface of an object to deposit a reactant (also referred to as a microwave plasma CVD method). The thickness of the gate insulating layer 108 is greater than or equal to 5 nm and less than or equal to 300 nm.

(Semiconductor Layer)

For the semiconductor layer 110, silicon or an oxide semiconductor can be used. In the manufacturing method of the present invention, the semiconductor layer 110 is formed over the first substrate 901. Therefore, the semiconductor layer 110 can be deposited at a temperature higher than or equal to 500° C. or can be subjected to annealing treatment. Thus, a transistor with high field effect mobility and high on-state current can be manufactured. Note that an oxide semiconductor which can be used for the semiconductor layer 110 is described in detail in Embodiment 3.

(Source Electrode Layer and Drain Electrode Layer)

The source electrode layer 112a and the drain electrode layer 112b are electrically connected to source and drain formation regions of the semiconductor layer 110. As a conductive film used for the source electrode layer 112a and the drain electrode layer 112b, for example, a metal film including an element selected from Al, Cr, Cu, Ta, Ti, Mo, and W, a metal nitride film including any of these elements (a titanium nitride film, a molybdenum nitride film, or a tungsten nitride film), or the like can be used. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Alternatively, the conductive film used for the source electrode layer 112a and the drain electrode layer 112b may be formed using a conductive metal oxide. As the conductive metal oxide, indium oxide ($In_2O_3$ or the like), tin oxide ($SnO_2$ or the like), zinc oxide (ZnO), indium tin oxide (ITO), indium zinc oxide ($In_2O_3$—ZnO or the like), or any of these metal oxide materials in which silicon oxide is contained can be used.

(Second Metal Layer)

The second metal layer 113 is provided so that the glass frit can be heated uniformly with laser light to be melted. By provision of the second metal layer 113, the layout of the first metal layer 107 overlapping with the sealant formation region can be freely set. The second metal layer 113 is provided so as to be in contact with the gate insulating layer 108 and overlap with the sealant 500. As a material of the second metal layer 113, the same material as the source electrode layer 112a and the drain electrode layer 112b can be used.

(Second Insulating Layer)

The second insulating layer 114 is provided in order to protect the transistors. The second insulating layer 114 can be formed using the material described in Embodiment 1 or the material which can be used for the gate insulating layer. In order to increase the adhesion of the sealant 500 to a layer in contact with the sealant 500, it is preferable that the second insulating layer 114 and the sealant 500 be provided in contact with each other in the organic electroluminescence device.

(Planarization Layer)

The planarization layer 116 is provided in order to reduce unevenness which is caused by the source electrode layer 112a and the drain electrode layer 112b. The planarization layer 116 can be formed using an organic resin material such as polyimide or acrylic, an inorganic insulating film such as a silicon oxide film, or the like. It is preferable that the planarization layer 116 in the sealant formation region be removed (that is, the sealant 500 and the planarization layer 116 do not overlap with each other). This is in order that the adhesion between the sealant 500 and a layer which is in contact with the sealant 500 and is provided over the first substrate 901 can be increased and thus an organic electroluminescence device with high air-tightness can be formed.

(Light-Emitting Element)

In the organic electroluminescence device which is one embodiment of the present invention, light emission is obtained from the light-emitting element 130. The light-emitting element 130 includes the organic compound-containing layer 120 between the first electrode layer 118 and the second electrode layer 122. The organic compound-containing layer 120 includes at least a light-emitting layer and has a plurality of layers. The organic compound-containing layer 120 is described in Embodiment 4.

In this embodiment, the organic electroluminescence device having a top emission structure is described; therefore, a conductive film that transmits visible light is used for the second electrode layer 122. It is preferable that a conductive film that reflects visible light be used for the first electrode layer 118. With the use of the conductive film that reflects visible light, efficiency of light extraction from the light-emitting element can be improved. One of the first electrode layer 118 and the second electrode layer 122 serves as an anode and the other serves as a cathode.

The conductive film that transmits visible light can be formed using, for example, indium oxide, ITO, indium zinc oxide, ZnO, or ZnO to which gallium is added. Alternatively, a film of a metal material such as gold, platinum, nickel, tungsten, chromium, molybdenum, iron, cobalt, copper, palladium, or titanium, or a nitride of any of these metal materials (e.g., titanium nitride) can be formed thin so as to have a light-transmitting property. Further alternatively, graphene or the like may be used.

The conductive film that reflects visible light can be formed using, for example, a metal material such as aluminum, gold, platinum, silver, nickel, tungsten, chromium, molybdenum, iron, cobalt, copper, or palladium; an aluminum-containing alloy (aluminum alloy) such as an alloy of aluminum and titanium, an alloy of aluminum and nickel, or an alloy of aluminum and neodymium; or a silver-containing alloy such as an alloy of silver and copper. An alloy of silver and copper is preferable because of its high heat resistance. The metal material or the alloy may include lanthanum, neodymium, or germanium.

(Partition Wall)

The partition wall 124 can be formed using an inorganic insulating material or an organic insulating material. As the organic insulating material, for example, a negative or positive photosensitive resin material, a non-photosensitive resin material, or the like can be used. Specifically, a polyimide resin, an acrylic resin, or the like can be used. It is preferable that the partition wall 124 have a forward tapered shape so that a film formed over the partition wall 124 is prevented from being broken. In a forward tapered shape, a layer gradually increases in thickness and is in contact with a layer serving as a base.

(Sealant)

The sealant 500 seals the light-emitting element 130 and forms an organic electroluminescence device with high air-tightness together with the first substrate 901 and the second substrate 902. The sealant 500 is provided in contact with the second insulating layer 114. The sealant 500 is provided so as to overlap with the second metal layer 113. The sealant 500 is preferably formed using a low-melting-point glass. The low-melting-point glass is formed by irradiating glass frit with laser light and the laser light is absorbed or reflected by the glass frit and the second metal layer. Since the second metal layer 113 is formed so as to overlap with a region where the first metal layer 107 and a region where a paste including glass frit is applied overlap with each other, heat of the laser light is applied to the glass frit uniformly and the low-melting-point glass uniform in quality can be formed. Thus, the organic electroluminescence device with high air-tightness can be obtained.

In the structure of the organic electroluminescence device which is one embodiment of the present invention, the second metal layer 113 is provided between the sealant 500 and the first metal layer 107; therefore, the layout of the first metal layer 107 overlapping with the sealant 500 can be freely set. Further, laser light is absorbed or reflected by the second metal layer 113; therefore, the sealant 500 uniform in quality can be formed and an organic electroluminescence device with high air-tightness can be obtained.

This embodiment can be combined with any of the other embodiments disclosed in this specification as appropriate.

Embodiment 3

In this embodiment, an oxide semiconductor which can be used for the semiconductor layer in Embodiment 2 is described in detail.

For example, an In-based metal oxide, a Zn-based metal oxide, an In—Zn-based metal oxide, or an In—Ga—Zn-based metal oxide can be used as the oxide semiconductor. Alternatively, a metal oxide including another metal element instead of part or all of Ga in the In—Ga—Zn-based metal oxide may be used.

As the aforementioned another metal element, for example, a metal element that is capable of combining with more oxygen atoms than gallium can be used, and one or more elements of titanium, zirconium, hafnium, germanium, and tin can be used, for instance. Alternatively, as the aforementioned another metal element, one or more elements of lanthanum, cerium, praseodymium, neodymium, samarium, europium, gadolinium, terbium, dysprosium, holmium, erbium, thulium, ytterbium, and lutetium may be used. These metal elements function as a stabilizer. Note that the amount of such a metal element added is determined so that the metal oxide can function as a semiconductor. When a metal element that is capable of combining with more oxygen atoms than gallium is used and oxygen is supplied to a metal oxide, oxygen defects in the metal oxide can be reduced.

Further, the semiconductor layer 110 may be a stacked layer of a first oxide semiconductor layer having an atomic ratio of In:Ga:Zn=1:1:1, a second oxide semiconductor layer having an atomic ratio of In:Ga:Zn=3:1:2, and a third oxide semiconductor layer having an atomic ratio of In:Ga:Zn=1:1:1. With the above stacked layer structure of the semiconductor layer 110, for example, field effect mobility of the transistor can be increased.

The oxide semiconductor may be a c-axis aligned crystalline oxide semiconductor (also referred to as CAAC-OS).

The CAAC-OS is one of oxide semiconductors including a plurality of crystal parts. In each of the crystal parts, for example, a c-axis is aligned in a direction parallel to a normal vector of a surface where an oxide semiconductor layer is formed or a normal vector of a surface of the oxide semiconductor layer. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. In this specification, a simple term "perpendicular" includes a range from 85° to 95°. In addition, a simple term "parallel" includes a range from −5° to 5°.

For example, the CAAC-OS can be formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby a crystal state of the sputtering target is transferred to a substrate. In this manner, the CAAC-OS is formed.

For the deposition of the CAAC-OS, the following conditions are preferably used.

For example, the CAAC-OS is formed while the impurity concentration is reduced, whereby the crystal state of the oxide semiconductor can be prevented from being broken by the impurities. For example, impurities (e.g., hydrogen, water, carbon dioxide, or nitrogen) which exist in a deposition chamber are preferably reduced. Further, impurities in a deposition gas are preferably reduced. For example, a deposition gas whose dew point is −80° C. or lower, preferably −100° C. or lower is preferably used as a deposition gas.

By increasing the substrate heating temperature during the deposition, migration of a sputtered particle is likely to occur after the sputtered particle is attached to a substrate surface. Specifically, the substrate heating temperature during the deposition is 100° C. or higher and 740° C. or lower. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_X$ powder in a predetermined ratio, applying pressure, and performing heat treatment at a temperature higher than or equal to 1000° C. and lower than or equal to 1500° C. Note that X, Y, and Z are each a given positive number. Here, the predetermined ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

A transistor whose channel formation region contains the CAAC-OS has high reliability because change in electric characteristics of the transistor due to irradiation with visible light or ultraviolet light is small.

The transistor containing the oxide semiconductor has low leakage current due to thermal excitation because of its wide bandgap. Further, the effective mass of a hole is large, which is 10 or more, and the height of the tunnel barrier is high, which is 2.8 eV or higher. Thus, the amount of tunnel current is small. Furthermore, the number of carriers in the semiconductor layer is very small; therefore, the off-state current can be made low. For example, the off-state current per micrometer of the channel width of the transistor at room temperature (25° C.) is lower than or equal to $1\times10^{-19}$ A (100 zA), preferably lower than or equal to $1\times10^{-22}$ A (100 yA). It is preferable that the off-state current of the transistor be as low as possible; the lowest value of the off-state current of the transistor is estimated to be about $1\times10^{-30}$ A/μm.

This embodiment can be combined with any of the other embodiments disclosed in this specification as appropriate.

Embodiment 4

In this embodiment, the light-emitting element in Embodiment 1 is described in detail.

Figure 5A:
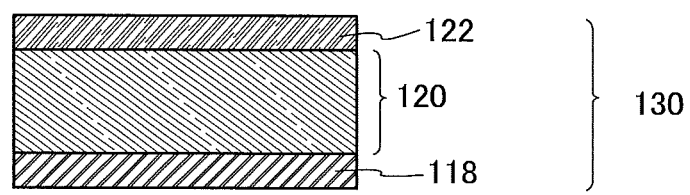
FIGS. 5A and 5B are each a cross-sectional view of a light-emitting element which can be used for an organic electroluminescence device according to one embodiment of the present invention.

The light-emitting element 130 illustrated in FIG. 5A has a structure in which the organic compound-containing layer 120 is sandwiched between a pair of electrodes (the first electrode layer 118 and the second electrode layer 122). Note that the first electrode layer 118 is used as an anode and the second electrode layer 122 is used as a cathode as an example in the following description of this embodiment.

The organic compound-containing layer 120 includes at least a light-emitting layer and may have a stacked-layer structure including a functional layer other than the light-emitting layer. Examples of the functional layer other than the light-emitting layer include a layer containing a substance having a high hole-injection property, a substance having a high hole-transport property, a substance having a high electron-transport property, a substance having a high electron-injection property, a bipolar substance (a substance having high electron and hole transport properties), or the like. Specifically, functional layers such as a hole-injection layer, a hole-transport layer, an electron-transport layer, and an electron-injection layer can be used in combination as appropriate.

The light-emitting element 130 illustrated in FIG. 5A emits light when current flows because of a potential difference generated between the first electrode layer 118 and the second electrode layer 122, and holes and electrons are recombined in the organic compound-containing layer 120. That is, a light-emitting region is formed in the organic compound-containing layer 120.

In this invention, light emission from the light-emitting element 130 is extracted to the outside from the first electrode layer 118 or the second electrode layer 122 side. Therefore, one or both of the first electrode layer 118 and the second electrode layer 122 are formed using a substance having a light-transmitting property.

Figure 5B:
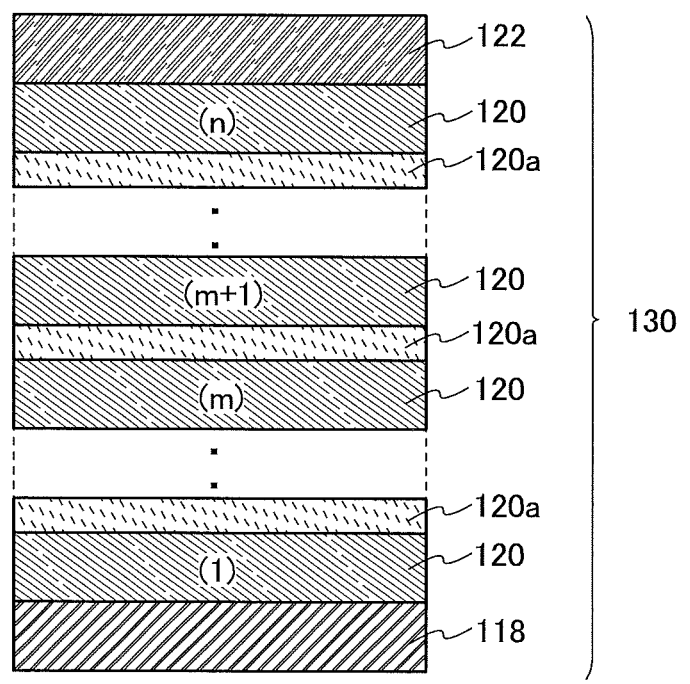

Note that a plurality of organic compound-containing layers 120 may be stacked between the first electrode layer 118 and the second electrode layer 122 as illustrated in FIG. 5B. In the case where n (n is a natural number of 2 or more) layers are stacked, a charge generation layer 120a is preferably provided between the m-th (m is a natural number of 1 or more and n−1 or less) organic compound-containing layer 120 and the (m+1)-th organic compound-containing layer 120.

The charge generation layer 120a may be formed of a composite material of an organic compound and a metal oxide, a metal oxide, or a composite material of an organic compound and an alkali metal, an alkaline earth metal, or a compound thereof; alternatively, these materials may be combined as appropriate. Examples of the composite material of an organic compound and a metal oxide include composite materials of an organic compound and a metal oxide such as vanadium oxide, molybdenum oxide, and tungsten oxide. As the organic compound, various compounds can be used; for example, a low molecular compounds such as an aromatic amine compound, a carbazole derivative, or aromatic hydrocarbon and a compound in which the basic skeleton is any of the low molecular compounds, such as oligomer, dendrimer, or polymer. As the organic compound, it is preferable to use the organic compound which has a hole-transport property and has a hole mobility of $10^{-6}$ cm$^2$/Vs or higher. However, another substance may be used instead of the above described materials as long as the substance has a hole-transport property higher than an electron-transport property. These materials used for the charge generation layer 120a are excellent in carrier-injection property and carrier-transport property, and thus the light-emitting element 130 can be driven with low current and with low voltage.

It is to be noted that the charge generation layer 120a may be formed with a combination of a composite material of an organic compound and a metal oxide and another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

As for the light-emitting element 130 having such a structure, problems such as energy transfer, quenching, and the like are unlikely to occur, and a light-emitting element which has both high light emission efficiency and long lifetime is easily obtained due to expansion in the choice of materials. Further, a light-emitting element which provides phosphorescence from one of light-emitting layers and fluorescence from the other of the light-emitting layers can be easily obtained.

Note that the charge generation layer 120a has a function of injecting holes to one of the organic compound-containing layers 120, which is formed in contact with the charge generation layer 120a, and a function of injecting electrons to the other of the organic compound-containing layers 120, when voltage is applied between the first electrode layer 118 and the second electrode layer 122.

The light-emitting element 130 illustrated in FIG. 5B can provide a variety of emission colors by changing the type of the light-emitting substance which is used for the organic compound-containing layer 120. In addition, a plurality of light-emitting substances of different colors are used as the light-emitting substance, whereby light emission having a broad spectrum or white light emission can also be obtained.

In the case where white light emission is obtained using the light-emitting element 130 illustrated in FIG. 5B, as for a combination of a plurality of organic compound-containing layers 120, a structure for emitting white light including red light, blue light, and green light may be used. For example, the structure may include a first light-emitting layer containing a blue fluorescent substance as a light-emitting substance and a second light-emitting layer containing green and red phosphorescent substances as light-emitting substances. Alternatively, a structure including a first light-emitting layer exhibiting red light, a second light-emitting layer exhibiting green light, and a third light-emitting layer exhibiting blue light may be employed. Also with a structure including light-emitting layers emitting light of complementary colors, white light emission can be obtained. When light emitted from the first light-emitting layer and light emitted from the second light-emitting layer have complementary colors to each other in a stacked-layer element including two light-emitting layers, the combination of colors are as follows: blue and yellow, blue-green and red, and the like.

In the structure of the above-described stacked-layer element, by providing the charge generation layer between the stacked light-emitting layers, the element can have long lifetime in a high-luminance region while keeping the current density low. In addition, a voltage drop due to the resistance of the electrode material can be reduced, whereby uniform light emission in a large area is possible.

This embodiment can be implemented in appropriate combination with the structures described in the other embodiments.

Embodiment 5

In this embodiment, examples of electronic devices or a lighting device using the organic electroluminescence device which is one embodiment of the present invention are described with reference to FIGS. 6A to 6E and FIGS. 7A to 7C.

Examples of the electronic devices to which the organic electroluminescence device is applied are a television device (also referred to as television or television receiver), a monitor of a computer or the like, a camera such as a digital camera or a digital video camera, a digital photo frame, a mobile phone (also referred to as cellular phone or cellular phone device), a portable game machine, a portable information terminal, an audio reproducing device, and a large-sized game machine such as a pachinko machine. Specific examples of these electronic devices are shown in FIGS. 6A to 6E.

Figure 6A:
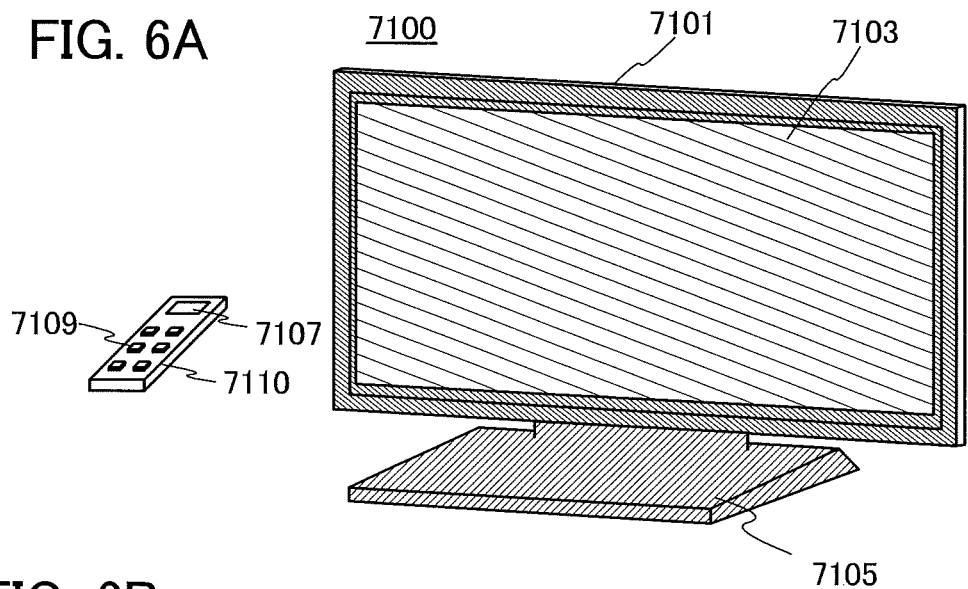
FIGS. 6A to 6E each illustrate an electronic device to which an organic electroluminescence device according to one embodiment of the present invention is applied.

FIG. 6A illustrates an example of a television device. In the television device 7100, a display portion 7103 is incorporated in a housing 7101. Images can be displayed by the display portion 7103, and the organic electroluminescence device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 6B:
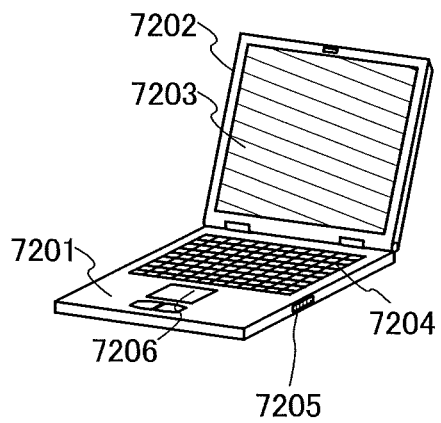

FIG. 6B illustrates a computer, which includes a main body 7201, a housing 7202, a display portion 7203, a keyboard 7204, an external connection port 7205, a pointing device 7206, and the like. This computer is manufactured by using the organic electroluminescence device for the display portion 7203.

Figure 6C:
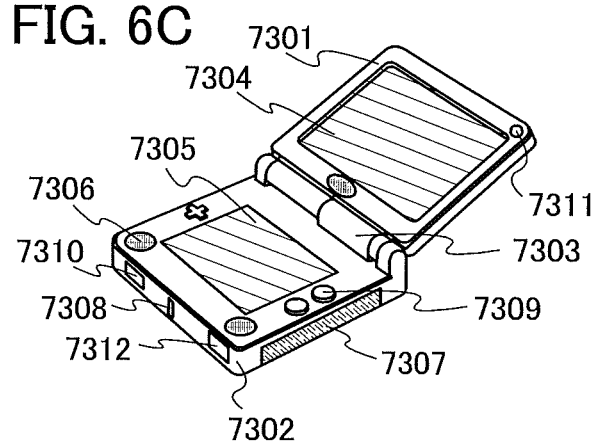

FIG. 6C illustrates a portable game machine having two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 6C includes a speaker portion 7306, a recording medium insertion portion 7307, an LED lamp 7308, an input unit (an operation key 7309, a connection terminal 7310, a sensor 7311 (sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. It is needless to say that the structure of the portable game machine is not limited to the above as far as the organic electroluminescence device can be used for at least either the display portion 7304 or the display portion 7305, or both, and may include other accessories arbitrarily. The portable game machine illustrated in FIG. 6C has a function of reading a program or data stored in a recording medium to display it in the display portion, and a function of sharing information with another portable game machine by wireless communication. Note that the functions of the portable game machine illustrated in FIG. 6C are not limited to these functions, and the portable game machine can have various functions.

Figure 6D:
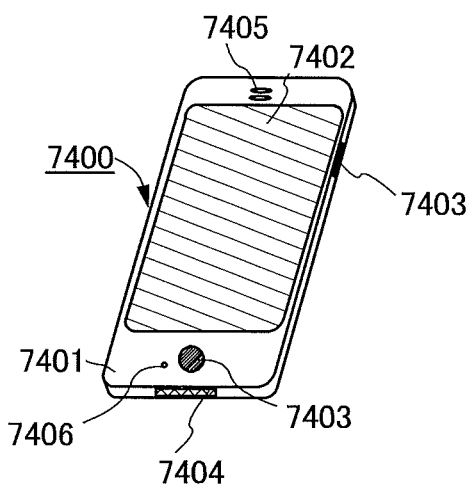

FIG. 6D illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using the organic electroluminescence device for the display portion 7402.

When the display portion 7402 of the mobile phone 7400 illustrated in FIG. 6D is touched with a finger or the like, data can be input into the mobile phone 7400. Further, operations such as making a call and composing e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be inputted. In this case, it is preferable to display a keyboard or number buttons on almost the entire screen of the display portion 7402.

When a detection device including a sensor for detecting inclination, such as a gyroscope sensor or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touch on the display portion 7402 or operation with the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 6E:
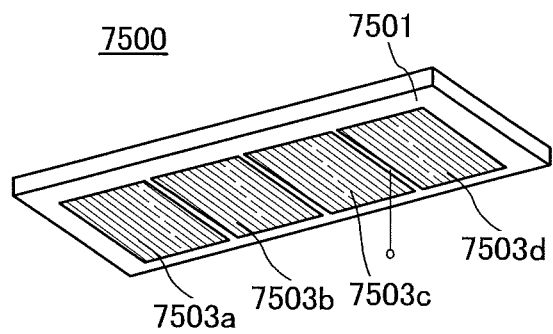

FIG. 6E illustrates an example of a lighting device. In a lighting device 7500, light-emitting devices 7503a, 7503b, 7503c, and 7503d to which one embodiment of the present invention is applied are incorporated in a housing 7501 as light sources. The lighting device 7500 can be attached to a ceiling, a wall, or the like.

Further, the light-emitting device includes a light-emitting panel which emits light having high brightness and a pale color and causing less eyestrain even in the case of long-time use, light of a bright red color, and light of a bright color different from the other colors. By adjusting conditions under which the light-emitting element is driven for each emission color, a lighting device whose hue can be adjusted by a user can be achieved.

Figure 7A:
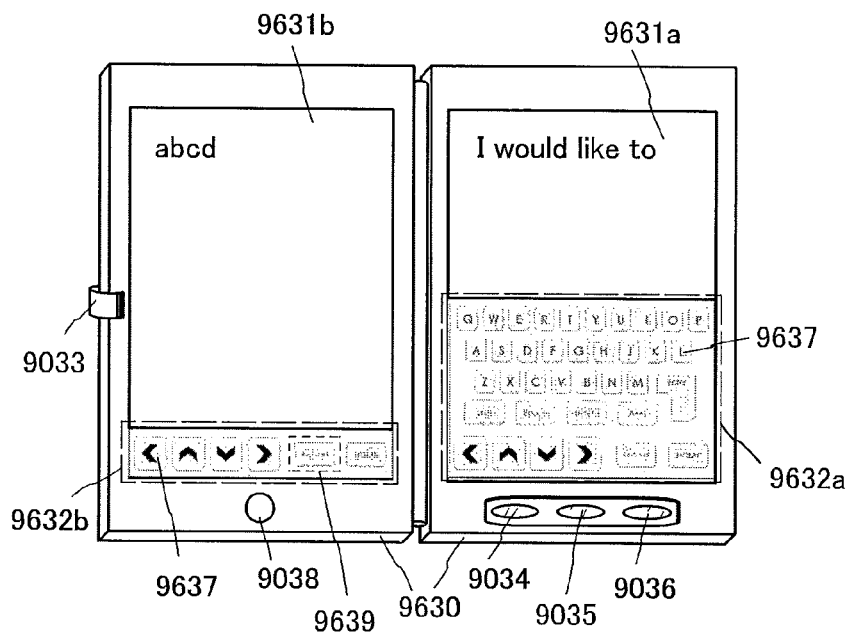
FIGS. 7A to 7C illustrate an electronic device to which an organic electroluminescence device according to one embodiment of the present invention is applied.
Figure 7B:
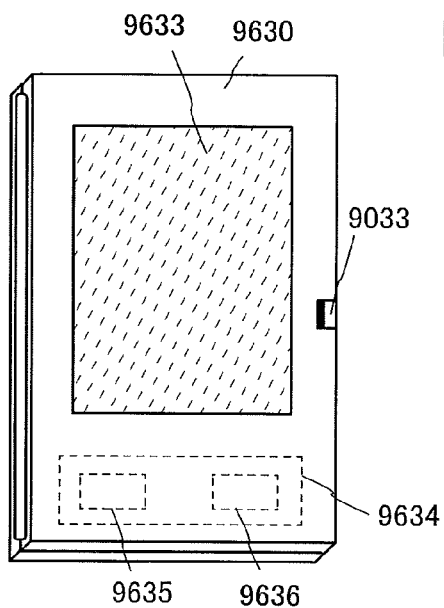

FIGS. 7A and 7B illustrate a tablet terminal that can be folded. In FIG. 7A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038. The tablet terminal is manufactured using the organic electroluminescence device for one or both of the display portion 9631a and the display portion 9631b.

A touch panel region 9632a can be provided in a part of the display portion 9631a, in which area, data can be input by touching displayed operation keys 9637. Note that FIG. 7A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 allows switching between a landscape mode and a portrait mode, color display and black-and-white display, and the like. With the power-saving-mode switching button 9036, the luminance of display can be optimized in accordance with the amount of external light at the time when the tablet terminal is in use, which is detected with an optical sensor incorporated in the tablet terminal. In addition to the optical sensor, other detecting devices such as sensors for detecting inclination, like a gyroscope sensor or an acceleration sensor, may be incorporated in the tablet terminal.

Although the display portion 9631*a* and the display portion 9631*b* have the same display area in FIG. 7A, one embodiment of the present invention is not limited to this example. The display portion 9631*a* and the display portion 9631*b* may have different areas or different display quality. For example, one of them may be a display panel that can display higher-definition images than the other.

FIG. 7B illustrates the tablet terminal folded, which includes the housing 9630, a solar battery 9633, a charge and discharge control circuit 9634, a battery 9635, and a DCDC converter 9636. Note that FIG. 7B shows an example in which the charge and discharge control circuit 9634 includes the battery 9635 and the DCDC converter 9636.

Since the tablet terminal can be folded in two, the housing 9630 can be closed when the tablet terminal is not in use. Thus, the display portions 9631*a* and 9631*b* can be protected, thereby providing a tablet terminal with high endurance and high reliability for long-term use.

The tablet terminal illustrated in FIGS. 7A and 7B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently, which is preferable. When a lithium ion battery is used as the battery 9635, there is an advantage of downsizing or the like.

Figure 7C:
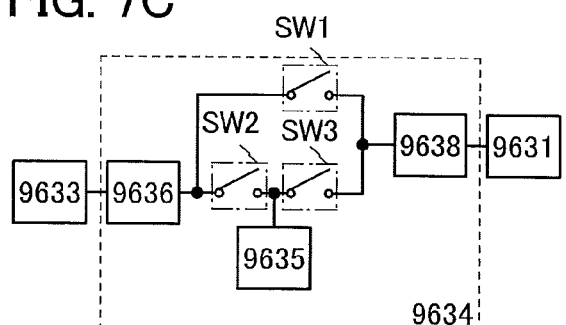

The structure and operation of the charge and discharge control circuit 9634 illustrated in FIG. 7B are described with reference to a block diagram of FIG. 7C. The solar battery 9633, the battery 9635, the DCDC converter 9636, a converter 9638, switches SW1 to SW3, and the display portion 9631 are illustrated in FIG. 7C, and the battery 9635, the DCDC converter 9636, the converter 9638, and the switches SW1 to SW3 correspond to the charge and discharge control circuit 9634 illustrated in FIG. 7B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the power from the solar battery 9633 is used for the operation of the display portion 9631, the switch SW1 is turned on and the voltage of the power is raised or lowered by the converter 9638 to a voltage needed for operating the display portion 9631. In addition, when display on the display portion 9631 is not performed, the switch SW1 may be turned off and the switch SW2 may be turned on so that the battery 9635 is charged.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

It is needless to say that one embodiment of the present invention is not limited to the electronic devices or the lighting device illustrated in FIGS. 6A to 6E and FIGS. 7A to 7C as long as the sealing structure or the organic electroluminescence device described in any of the above embodiments is included.

The electronic devices and the lighting device described above each include the sealing structure or the organic electroluminescence device to which one embodiment of the present invention is applied. Therefore, a highly reliable electronic device or a highly reliable lighting device can be manufactured.

This embodiment can be combined with any of the other embodiments disclosed in this specification as appropriate.

This application is based on Japanese Patent Application serial no. 2012-168388 filed with Japan Patent Office on Jul. 30, 2012, the entire contents of which are hereby incorporated by reference.

What is claimed is:

1. A sealing structure comprising:
a first substrate;
a second substrate facing with the first substrate;
a sealant for sealing a space between the first substrate and the second substrate;
a circuit portion inside the sealant;
a plurality of first metal layers between the first substrate and the sealant;
a second metal layer between the plurality of the first metal layers and the sealant, the second metal layer being provided between the circuit portion and an edge of the second substrate; and
a first insulating layer between the plurality of the first metal layers and the second metal layer,
wherein the plurality of the first metal layers and the second metal layer are electrically insulated from each other by the first insulating layer,
wherein the sealant does not overlap with the circuit portion,
wherein in a first region, the second metal layer and the sealant extend along the edge of the second substrate,
wherein each of the plurality of the first metal layers intersects with the second metal layer and the sealant,
wherein a width of the second metal layer is larger than a width of the sealant in the first region,
wherein the width of the second metal layer and the width of the sealant are physical extent perpendicular to the edge of the second substrate, and
wherein the sealant comprises glass.

2. The sealing structure according to claim 1, further comprising a second insulating layer between the second metal layer and the sealant.

3. The sealing structure according to claim 1, wherein the second metal layer has holes.

4. The sealing structure according to claim 1, wherein one of the plurality of the first metal layers functions as a common power supply line of an organic electroluminescence device.

5. An organic electroluminescence device comprising:
a first substrate;
a second substrate facing with the first substrate;
a light-emitting element over the first substrate;
a sealant between the first substrate and the second substrate and sealing the light-emitting element;
a circuit portion inside the sealant;

a plurality of the first metal layers between the first substrate and the sealant;

a second metal layer between the plurality of the first metal layers and the sealant, the second metal layer being provided between the circuit portion and an edge of the second substrate; and a first insulating layer between the plurality of the first metal layers and the second metal layer, wherein the plurality of the first metal layers and the second metal layer are electrically insulated from each other by the first insulating layer, wherein the sealant does not overlap with the circuit portion, wherein in a first region, the second metal layer and the sealant extend along the edge of the second substrate, wherein each of the plurality of the first metal layers intersects with the second metal layer and the sealant, wherein a width of the second metal layer is larger than a width of the sealant in the first region, wherein the width of the second metal layer and the width of the sealant are physical extent perpendicular to the edge of the second substrate, and wherein the sealant comprises glass.

6. The organic electroluminescence device according to claim 5, further comprising a second insulating layer between the second metal layer and the sealant.

7. The organic electroluminescence device according to claim 5, further comprising a transistor electrically connected to one of the plurality of the first metal layers.

8. The organic electroluminescence device according to claim 7, wherein the first insulating layer functions as a gate insulating layer of the transistor.

9. The organic electroluminescence device according to claim 7, further comprising a second insulating layer between the second metal layer and the sealant, wherein the second insulating layer also covers the transistor.

10. The organic electroluminescence device according to claim 5, wherein the second metal layer has holes.

11. The organic electroluminescence device according to claim 5, wherein one of the plurality of the first metal layers functions as a common power supply line.

12. An organic electroluminescence device comprising:
a first substrate;
a second substrate facing with the first substrate;
a light-emitting element over the first substrate;
a sealant between the first substrate and the second substrate and sealing the light-emitting element;
a circuit portion inside the sealant;
a plurality of first metal layers between the first substrate and the sealant;
a second metal layer between the plurality of the first metal layers and the sealant, the second metal layer being provided between the circuit portion and an edge of the second substrate;
a first insulating layer between the plurality of the first metal layers and the second metal layer,
a second insulating layer over and in contact with the second metal layer; and
a third insulating layer over the second insulating layer,
wherein the plurality of the first metal layers and the second metal layer are electrically insulated from each other by the first insulating layer,
wherein the sealant is in contact with the second insulating layer through a groove in the third insulating layer,
wherein in a first region, the second metal layer and the sealant extend along the edge of the second substrate,
wherein each of the plurality of the first metal layers intersects with the second metal layer and the sealant,
wherein a width of the second metal layer is larger than a width of the sealant in the first region,
wherein the width of the second metal layer and the width of the sealant are physical extent perpendicular to the edge of the second substrate, and
wherein the sealant comprises glass.

13. The organic electroluminescence device according to claim 12, further comprising a transistor electrically connected to one of the plurality of the first metal layers.

14. The organic electroluminescence device according to claim 12, wherein the second metal layer has holes.

15. The organic electroluminescence device according to claim 12, wherein one of the plurality of the first metal layers functions as a common power supply line.

16. The sealing structure according to claim 1, wherein in a region where the sealant overlaps with the plurality of the first metal layers, each of the plurality of the first metal layers is covered with the second metal layer.

17. The organic electroluminescence device according to claim 5, wherein in a region where the sealant overlaps with the plurality of the first metal layers, each of the plurality of the first metal layers is covered with the second metal layer.

18. The organic electroluminescence device according to claim 12, wherein in a region where the sealant overlaps with the plurality of the first metal layers, each of the plurality of the first metal layers is covered with the second metal layer.

* * * * *